(12) United States Patent
Black et al.

(10) Patent No.: US 6,748,201 B2
(45) Date of Patent: Jun. 8, 2004

(54) GAIN CONTROL FOR COMMUNICATIONS DEVICE

(75) Inventors: Peter J. Black, San Diego, CA (US); Nagabhushana Sindhushayana, San Diego, CA (US); Raghu Challa, San Diego, CA (US); Kevin Seltmann, Vista, CA (US)

(73) Assignee: Qualcomm Inc., San Diego, CA (US)

( * ) Notice: Subject to any disclaimer, the term of this patent is extended or adjusted under 35 U.S.C. 154(b) by 218 days.

(21) Appl. No.: 10/112,642

(22) Filed: Mar. 28, 2002

(65) Prior Publication Data

US 2003/0186665 A1 Oct. 2, 2003

(51) Int. Cl.$^7$ ................................................ H04B 1/38
(52) U.S. Cl. .......................... 455/240.1; 455/239.1; 455/341
(58) Field of Search ................. 455/67.11, 115.1, 455/127.2, 136, 138, 219, 226.1, 232.1, 234.1, 239.1, 240.1, 245.1, 250.1, 341; 330/289–297

(56) References Cited

U.S. PATENT DOCUMENTS

| | | | |
|---|---|---|---|
| 4,901,307 A | | 2/1990 | Gilhousen et al. ............ 370/18 |
| 5,103,459 A | | 4/1992 | Gilhousen et al. ............ 375/1 |
| 5,471,654 A | * | 11/1995 | Okazaki et al. ............. 455/126 |
| 5,603,106 A | * | 2/1997 | Toda ......................... 455/126 |
| 6,167,242 A | * | 12/2000 | Henderson et al. ......... 455/126 |
| 6,466,772 B1 | * | 10/2002 | Rozenblit et al. ........... 455/126 |
| 6,480,061 B2 | * | 11/2002 | Dolman et al. ................ 330/2 |
| 6,535,068 B1 | * | 3/2003 | Lynaugh ..................... 330/289 |

FOREIGN PATENT DOCUMENTS

JP           7-122942 A  *  5/1995

* cited by examiner

Primary Examiner—Edward F. Urban
Assistant Examiner—Thuan T. Nguyen
(74) Attorney, Agent, or Firm—Philip R. Wadsworth; Kent D. Baker; Sandra L. Godsey

(57) ABSTRACT

Systems and techniques for gain control include amplifying a signal with an amplifier having a gain represented by one of a plurality of gain curves depending on a value of a parameter, the signal being amplified at a first one of the parameter values, and controlling the gain of the amplified signal from a predetermined gain curve relating to the gain curve of the amplifier for a second one of the parameter values by adjusting a gain control signal corresponding to a point on the predetermined gain curve as a function of the first one of the parameter values, and applying the adjusted gain control signal to the amplifier. It is emphasized that this abstract is provided to comply with the rules requiring an abstract which will allow a searcher or other reader to quickly ascertain the subject matter of the technical disclosure.

86 Claims, 6 Drawing Sheets

GAIN CONTROL FOR COMMUNICATIONS DEVICE

BACKGROUND

1. Field

The present invention relates to communications systems, and more specifically, to systems and techniques for controlling gain of a communications device.

2. Background

Communications systems generally support the exchange of information between two or more communications devices. These communications devices typically include an analog frontend to interface with a communications medium and a digital processor for manipulating the information. Depending on the type of communications device, the analog frontend may be designed with a transmitter, a receiver, or both. The function of the transmitter is to modulate, upconvert, and amplify signals for transmission into free space. The function of the receiver is to detect signals in the presence of noise and interference, and provide amplification, downconversion, and demodulation the detected the signal such that it can be displayed or used by the digital processor.

The receiver typically includes gain control which is commonly referred to in the art as automatic gain control (AGC). One of the purposes of the AGC function in the receiver is to maintain a constant output power over a range of signal input variations. This is typically achieved with an AGC which averages the output power from the receiver and feedbacks this average to the control the gain of the receiver.

In mobile wireless applications, the AGC function may also be employed in the mobile transmitter to prevent a mobile user near a base station from jamming a mobile user that is distant from the base station. The AGC function is performed in the mobile by feeding back the average receiver output power to control the gain of the transmitter in step with the receiver. Thus, if the mobile moves closer to the base station increasing the received power, the AGC will reduce the gain of the receiver and transmitter proportionally. This will result in a proportionally lower mobile transmitter power as the mobile user approaches the base station. This power control technique is often referred to as an open loop control.

The non-linear gain characteristics of the receiver and transmitter may prevent the AGC from operating in an optimal manner. Accordingly, a linearizer is often used in the AGC as a way of compensating for these non-linearities in the receiver and transmitter. A linearizer can be implemented in any number of fashions. One common technique involves the use of a "look up" table stored in memory to convert the average receiver power into a gain control signal that compensates for the non-linear gain characteristics of the receiver or transmitter. The contents of the "look up" table are determined during a calibration procedure. The calibration procedure generally entails tracking the average power output from the receiver with the AGC loop closed as the input power to the receiver is swept across a specified operating range for different frequency and temperature variations.

To maintain the commercial viability of the communications device, the manufacturer often strives for a simple calibration procedure which reduces the demand on labor resources. Unfortunately, this procedure often dictates a calibration procedure performed over the absolute minimum number of operating frequencies and temperatures that meet the precision requirements of the AGC. The potential drawbacks with a relatively simple calibration procedure become more pronounced with the introduction of multi-media communications devices into the marketplace. By way of example, a multi-media communications device supporting both legacy voice equipment and new data services may require separate calibration procedures for each. Accordingly, there is a need for a communications device that can be supported with a simple calibration procedure that cannot only support different operating frequencies and temperatures, but can also support multi-media modes of operation.

SUMMARY

In one aspect of the present invention, a method of gain control includes amplifying a signal with an amplifier having a gain represented by one of a plurality of gain curves depending on a value of a parameter, the signal being amplified at a first one of the parameter values, and controlling the gain of the amplified signal from a predetermined gain curve relating to the gain curve of the amplifier for a second one of the parameter values by adjusting a gain control signal corresponding to a point on the predetermined gain curve as a function of the first one of the parameter values, and applying the adjusted gain control signal to the amplifier.

In another aspect of the present invention, an apparatus includes an amplifier having a gain represented by one of a plurality of gain curves depending on a value of a parameter, and a gain control configured to control the gain of the amplifier from a predetermined gain curve relating to the gain curve of the amplifier for a first one of the parameter values by adjusting a gain control signal corresponding to a point on the predetermined gain curve as a function of a second one of the parameter values, and applying the adjusted gain control signal to the amplifier.

In yet another aspect of the present invention, computer readable media embodies a method of controlling gain of an amplifier having a gain represented by one of a plurality of gain curves depending on a value of a parameter, the method including storing a predetermined gain curve relating to the gain curve of the amplifier for a first one of the parameter values, adjusting a gain control signal corresponding to a point on the predetermined gain curve as a function of a second one of the parameter values, and applying the adjusted gain control signal to the amplifier.

In a further aspect of the present invention, an apparatus includes amplifier means for amplifying a signal, the amplifier means having a gain represented by one of a plurality of gain curves depending on a value of a parameter, and gain control means for controlling the gain of the amplifier from a predetermined gain curve relating to the gain curve of the amplifier means for a first one of the parameter values by adjusting a gain control signal corresponding to a point on the predetermined gain curve as a function of a second one of the parameter values, and applying the adjusted gain control signal to the amplifier.

In yet a further aspect of the present invention, an apparatus includes a receiver having a gain represented by one of a plurality of receiver gain curves depending on a value of a receiver parameter, a transmitter having a gain represented by one of a plurality of transmitter gain curves depending on a value of a transmitter parameter, and a gain control configured to control the gain of the receiver from a predetermined receiver gain curve relating to the receiver gain curve of the receiver for a first one of the receiver parameter values by adjusting a receiver gain control signal corresponding to a point on the predetermined gain curve as a function of a second one of the receiver parameter values, and applying the adjusted receiver gain control signal to the receiver, the gain control further being configured to control the gain of the transmitter from a predetermined transmitter gain curve relating to the transmitter gain curve of the transmitter for a first one of the transmitter parameter values by adjusting a transmitter gain control signal corresponding to a point on the predetermined transmitter gain curve as a function of a second one of the transmitter parameter values, and applying the adjusted transmitter gain control signal to the transmitter.

It is understood that other aspects of the present invention will become readily apparent to those skilled in the art from the following detailed description, wherein is shown and described only exemplary embodiments of the invention, simply by way of illustration. As will be realized, the invention is capable of other and different embodiments, and its several details are capable of modifications in various respects, all without departing from the invention. Accordingly, the drawings and description are to be regarded as illustrative in nature, and not as restrictive.

BRIEF DESCRIPTION OF THE DRAWINGS

Aspects of the present invention are illustrated by way of example, and not by way of limitation, in the accompanying drawings in which like reference numerals refer to similar elements.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well known structures and devices are shown in block diagram form in order to avoid obscuring the concepts of the present invention.

In an exemplary embodiment of a communications device, a predetermined gain curve that compensates for the nonlinear characteristics of an amplifier can be computed through a calibration procedure at a fixed operating temperature and frequency. The predetermined gain curve can then be used to compute a gain control signal for the amplifier by adjusting a point on the predetermined gain curve relating to the output power of the amplifier as a function of the operating frequency and temperature. The amplifier can be a stand-alone amplifier, or alternatively, one or more amplifiers that make up a receiver or transmitter. This concept can further be extended to support multi-media devices where the point on the predetermined curve relating to the output power of the amplifier is adjusted according to the mode of operation.

Various aspects of these gain control techniques will be described in the context of a CDMA communications system, however, those skilled in the art will appreciate that these gain control techniques are likewise suitable for use in various other communications environments. Accordingly, any reference to a CDMA communications system is intended only to illustrate the inventive aspects of the present invention, with the understanding that such inventive aspects have a wide range of applications.

CDMA is a modulation and multiple access scheme based on spread-spectrum communications. In a CDMA communications system, a large number of signals share the same frequency spectrum and, as a result, provide an increase in user capacity. This is achieved by transmitting each signal with a different pseudo-random noise (PN) code that modulates a carrier, and thereby, spreads the spectrum of the signal waveform. The transmitted signals are separated in the receiver by a correlator that uses a corresponding PN code to despread the desired signal's spectrum. The undesired signals, whose PN codes do not match, are not despread in bandwidth and contribute only to noise.

Figure 1:
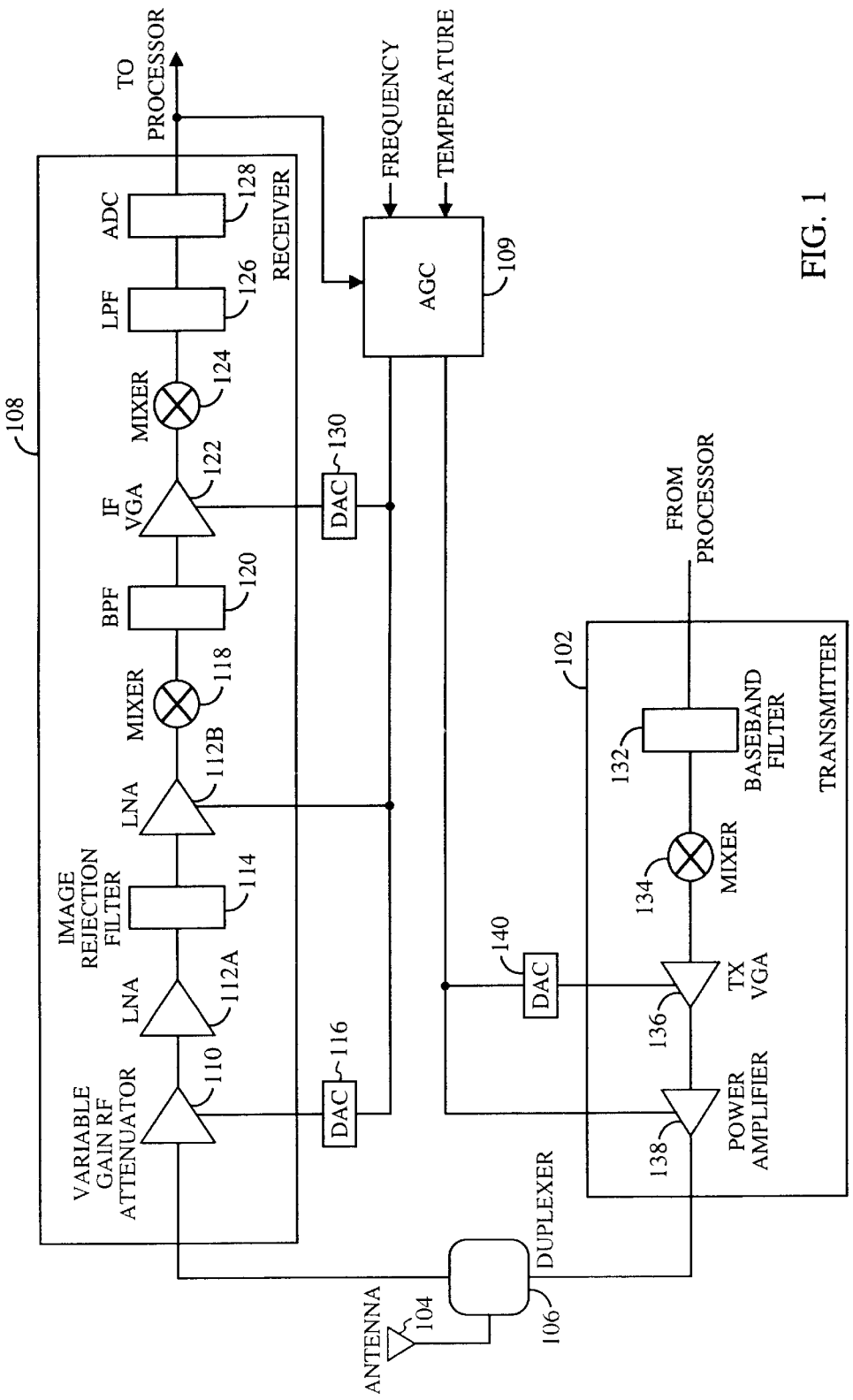
FIG. 1 is a functional block diagram of an exemplary analog frontend with gain control.

FIG. 1 depicts a functional block diagram of an exemplary analog frontend for use in a subscriber station such as a mobile CDMA communications device. Alternatively, the analog frontend can be used in a base station. The analog frontend can operate in either a transmit or receive mode. In the transmit mode, the transmitter 102 can be coupled to an antenna 104 through a duplexer 106 for reverse link transmissions to a base station (not shown). The reverse link refers to transmissions from the subscriber station to the base station. In the receive mode, the duplexer 106 directs a forward link transmission picked up by antenna 104 to the receiver 108. The forward link refers to transmissions from the base station to the subscriber station. The position of the duplexer 106 can be controlled by means well known in the art. The output of the receiver is fed back to control the transmitter and receiver gains through an AGC 109. In the described exemplary embodiment, the AGC 109 is responsive to temperature and frequency variations. In multi-media applications, the AGC 109 can be adapted to support different modes of operation such as voice or data applications. For the purposes of illustration, the AGC techniques will be described with reference to the reverse link, however, as those skilled in the art will readily appreciate, these AGC techniques are equally applicable to the forward link.

In the described exemplary embodiment, the receiver 108 can be based on a heterodyne complex (I-Q) architecture. For ease of explanation, the exemplary receiver 108 is depicted functionally without reference to separate I (in-phase) and Q (quadrature) channels. A variable gain RF attenuator 110 in combination with dual low noise amplifiers 112*a* and 112*b* (LNAs) can be used to provide good gain distribution throughout the receiver 108. In at least one embodiment of the receiver, the LNAs can be equipped with bypass capability. An image rejection filter 114 can be positioned between the LNAs 112a and 112b to reject image noise. A digital-to-analog converter (DAC) 116 can be used at the output of the AGC 109 to convert a digital RF gain control signal into an analog signal for controlling the attenuation level of the variable RF attenuator 110. The AGC 109 can be further configured to bypass one or both of the LNAs 112a and 112b via a LNA control signal.

The output from the LNA 112b can be coupled to an IF mixer 118 where it is mixed with a reference signal generated by a local oscillator (LO) (not shown). A bandpass filter 120 positioned at the output of the IF mixer 118 can be used to select an intermediate frequency (IF), i.e., the beat frequency between the received transmission and the reference signal. The IF output from the bandpass filter 120 can be provided to an IF variable gain amplifier (VGA) 122 before being mixed with a second reference signal from the LO by a baseband mixer 124. A low pass filter 126 positioned at the output of the baseband mixer 124 can be used to pass the baseband component of the mixed signal to an analog-to-digital converter (ADC) 128. The digital baseband signal from the ADC 128 can be provided to a processor (not shown) where it can be quadrature demodulated with short PN codes, decovered by Walsh codes, descrambled using a long PN code and decoded with forward error correction. A second DAC 130 can be used at the output of the AGC 109 to convert a digital IF gain control signal into an analog signal for controlling the gain of the IF VGA 122.

The digital baseband signal from the ADC 128 can also be used to drive the AGC 109. Alternatively, the digital baseband signal can be provided to a rake receiver (not shown) in the processor. The rake receiver can be configured with multiple demodulating elements (fingers) and a searcher. The searcher identifies strong multipath arrivals and assigns a finger to demodulate at the offset identified. The demodulated digital baseband signal for the best finger can then be used drive the AGC 109.

In the described exemplary embodiment, the transmitter 102 uses a direct conversion architecture. Alternatively, the transmitter 102 can be designed with one or more IF stages. The transmitter 102 can be implemented to receive multiple Walsh channels spread with a long PN code and quadrature modulated with short PN codes. A baseband filter 132 can be used to reject out of band components of the quadrature modulated signal and for pulse shaping. The filtered signal can be provided to an RF mixer 134 where it is modulated onto a carrier waveform. The modulated carrier waveform can then be coupled to transmitter VGA 136 and eventually a power amplifier 138 for transmission into free space through the antenna 104. A bandpass filter (not shown) may be disposed after the power amplifier 138 to filter out unwanted frequencies before transmission through the antenna 104. The power amplifier 138 can be configured to support four driver states with the ability to power down and bypass the power amplifier 138 should the transmitter power be low enough that the transmitter VGA 136 can support the reverse link transmission. The AGC 109 can be configured to control the state of the power amplifier 138 and the gain of the transmitter VGA 136. A third DAC 140 can be used to convert a digital transmitter gain control signal into an analog signal for controlling the gain of the transmitter VGA 136.

Figure 2:
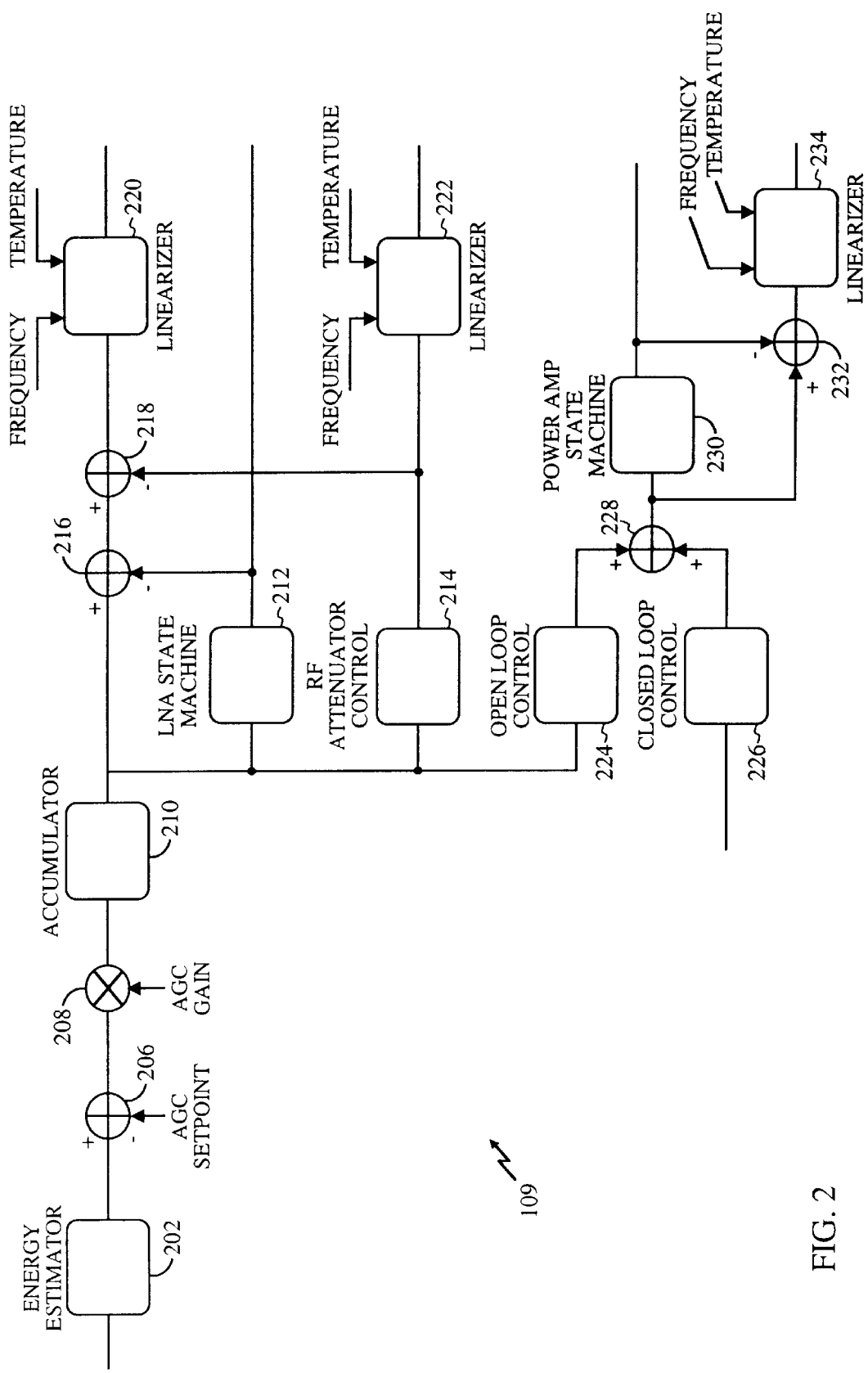
FIG. 2 is a functional block diagram of an exemplary gain control with multiple linearizers.

A functional block diagram of an exemplary AGC 109 is shown in FIG. 2 in the context of a High Data Rate (HDR) CDMA communications system. The HDR communications system is typically designed to conform one or more standards such as the "cdma2000 High Rate Packet Data Air Interface Specification," 3GPP2 C.S0024, Version 2, Oct. 27, 2000, promulgated by a consortium called "3$^{rd}$ Generation Partnership Project." An example of such an HDR communications is disclosed in U.S. patent application Ser. No. 08/963,386, entitled "Method and Apparatus for High Rate Packet Data Transmission," filed Nov. 3, 1997, now Pat. No. 6,574,211, issued Jun. 3, 2003 to Padovani et al. The contents of the aforementioned standard and patent application are incorporated herein by reference. As those skilled in the art will appreciate, the inventive concepts of the AGC discussed throughout are equally applicable to other communications devices.

In the described exemplary embodiment, the AGC can be used to measure the power output from the receiver and provide feedback to control the gain of both the transmitter and receiver. The feedback signal can be generated by comparing the measured output power of the receiver with an AGC set point. If the measured output power of the receiver is below the AGC set point, then the feedback signal provided to the transmitter and receiver can be used to respectively increase the gains. Conversely, if the measured output power of the receiver is above the set point, then the feedback signal provided to the transmitter and receiver can be used to respectively decrease the gains.

Referring to FIG. 2, the digital baseband signal from the receiver in the analog frontend, or from the rake receiver in the processor, can be coupled to an energy estimator 202. The energy estimator 202 computes the output power of the receiver by accumulating the ($I^2+Q^2$) values during a gated pilot burst. In HDR communications systems, the base station generally transmits a gated pilot signal over the forward link. In other communications systems employing the inventive AGC techniques described throughout, the period of accumulation can be readily ascertained by one of ordinary skill in the art to optimize performance. The AGC set point can then be subtracted from the computed output power from the energy estimator 202 by a subtractor 206. The resultant difference between the AGC set point and the computed output power represents the error in the output power of the receiver from the AGC set point. The error signal is scaled with an AGC gain by a multiplier 208. The scaled error signal can then be provided to an AGC accumulator 210 for averaging over one or more pilot bursts. In at least one embodiment, the AGC accumulator 210 saturates at a maximum and minimum threshold. The resultant average of the scaled error signal is referred to as an "AGC value" and is used to control the gains of the receiver and transmitter.

An LNA state machine 212 can be used to determine which of the two frontend LNAs in the receiver will be bypassed in response to the average output power of the receiver, i.e., the AGC value. As the AGC value increases, the LNA state machine 212 can be used to switch out or bypass the LNAs one after the other. With this approach, the dynamic range of the variable gain RF attenuator in the receiver can be smaller because less attenuation is required with one or both LNA's switched out. Conversely, as the average output power of the receiver decreases, the LNA state machine 212 can be used to switch back the LNAs, one after the other, into the receiver signal path.

An RF attenuation control 214 can be used to control the attenuation level of the variable gain RF attenuator in the receiver. The attenuation characteristics of the RF attenuator control 214 may take on various forms depending on the specific application and the overall design parameters. By way of example, the RF attenuator control 214 can be configured to provide zero attenuation below a minimum AGC value. When the AGC value exceeds this minimum threshold, the level of attenuation can increase linearly with the AGC value until the AGC value reaches a maximum. The attenuation characteristics of the RF attenuation control 214 can configured with a relatively flat response out after reaching this maximum.

In the event that one or both LNAs are switched out in the receiver, the gain of the IF VGA should be increased to maintain the total gain of the receiver constant. This can be accomplished by adjusting the AGC value that controls the gain of the IF VGA in the receiver with a LNA offset. The LNA offset is a function of the state of the LNA state machine 212. Similarly, if the attenuation of the variable gain RF attenuation is increased, the AGC value that controls the gain of the IF VGA in the receiver should be further adjusted by an RF attenuator offset. These adjustments can be implemented with subtractors 216 and 218 as shown in FIG. 2. Subtractors 216 and 218 can be used in AGC configurations where the gain of the IF VGA in the receiver varies inversely with the IF gain control signal from the AGC. The IF gain control signal from the subtractors 216 and 218, and the RF gain control signal from the RF attenuator control 214 can be provided to their respective linearizers 220 and 222.

Figure 3:
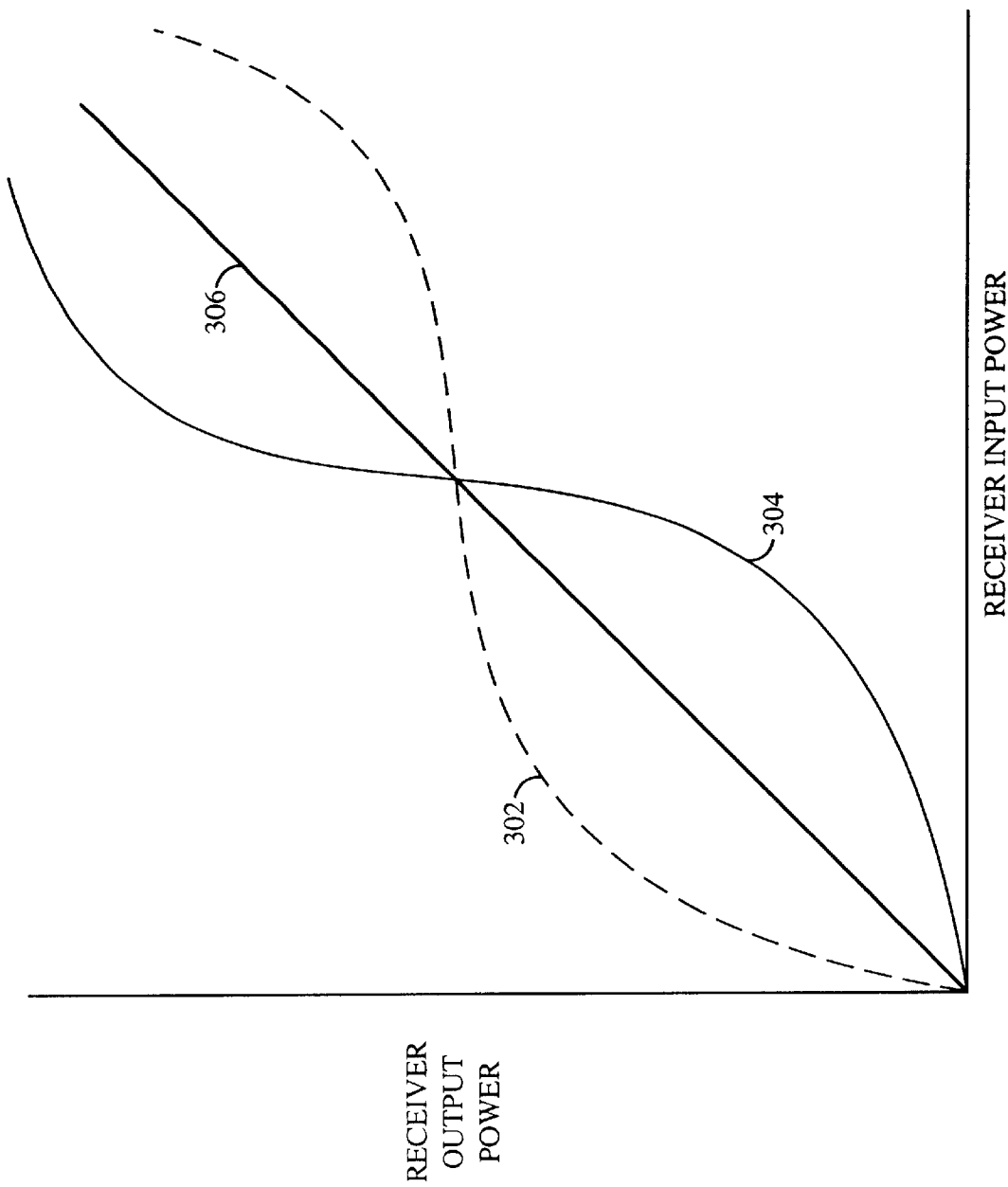
FIG. 3 is a graphical representation of the non-linear gain characteristics of the amplifiers in the exemplary analog frontend and an exemplary predetermined gain curve for compensating for the non-linearities of the amplifiers.

A linearizer can be used to compensate both the RF and IF gain controls for the non-linearities of the receiver. The linearizer can be implemented in a variety of ways depending on the specific design criteria. In at least one embodiment, the linearizer can be equipped with memory that stores a predetermined gain curve. FIG. 3 shows such a predetermined gain curve. The actual gain curve of the receiver is shown by curve 302. The memory can be used to store the predetermined gain curve, obtained through calibration, which can be the inverse of the actual gain curve for the receiver. The predetermined gain curve which is shown by curve 304. When the predetermined gain curve 304 stored in memory is applied to the AGC value, the result is a linear relationship between the output power of the receiver and the gain controls for the variable gain RF attenuator and the IF VGA as shown by curve 306.

Figure 4:
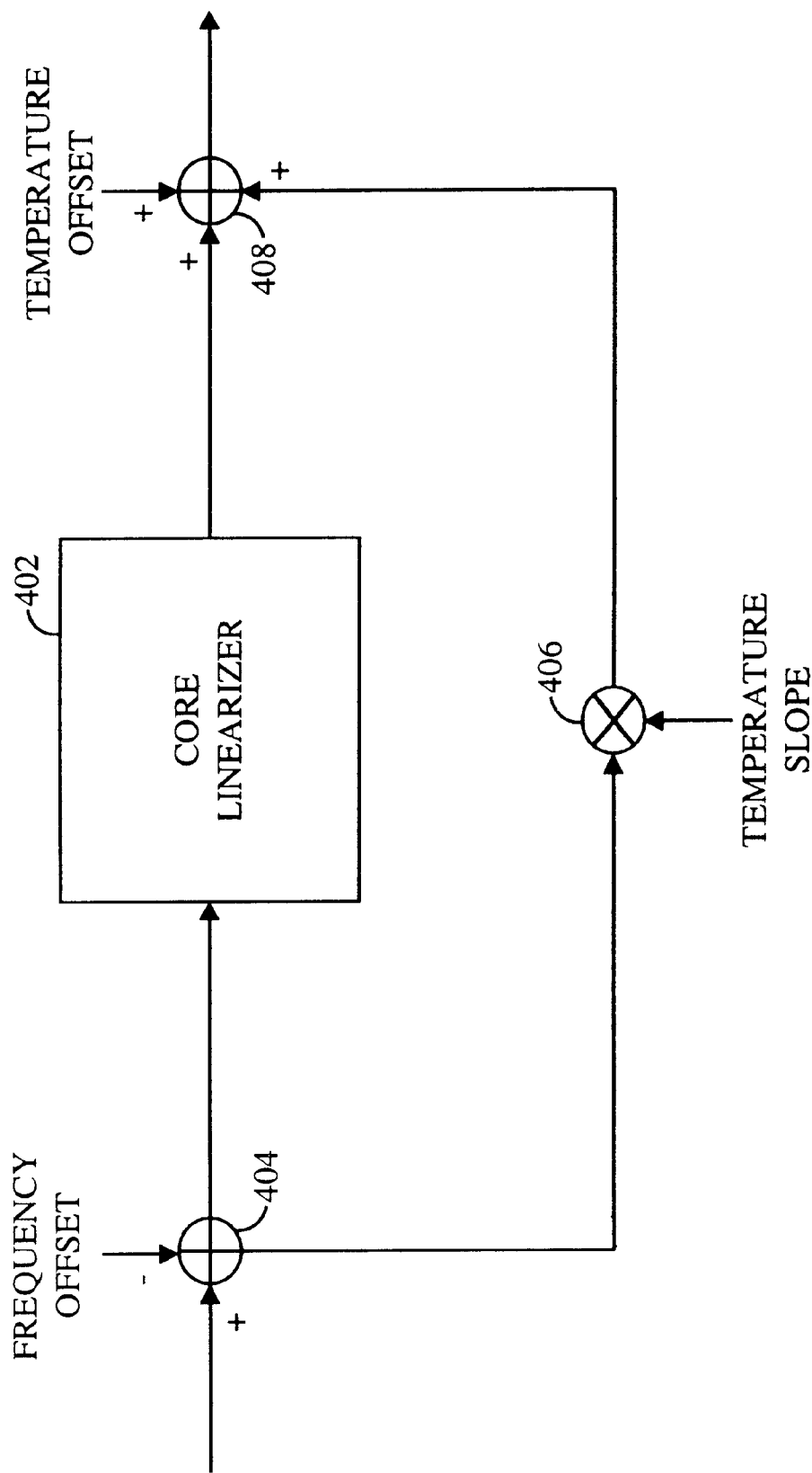
FIG. 4 is a functional block diagram of an exemplary linearizer for use in the gain control of FIG. 2.

The actual gain curve of the receiver will generally vary as a function of temperature and carrier frequency. In at least one embodiment, any number of predetermined gain curves can be stored in memory to provide linearized gain controls at various temperatures and frequencies. Depending on the number of curves, this approach could consume significant memory. Alternatively, the linearizer can be implemented with a single predetermined gain curve with temperature and frequency compensation. FIG. 4 shows a functional block diagram of an exemplary linearizer employing this concept. The linearizer includes a core linearizer 402 to store a predetermined gain curve at a reference frequency and temperature. Frequency compensation can be accomplished by applying an offset to the points on the predetermined curve along the x-axis, i.e., horizontal axis, with an operator 404. An operator is any hardware or software which performs a mathematical function. By way of example, in the described exemplary linearizer, the operator 404 is an adder. The output of the operator 404 can be provided to the core linearizer 402 to read out a data point on the predetermined gain curve. The output of the operator 404 can also be provided to a second operator 406. The second operator 406 can be used to offset the slope of the predetermined gain to compensate for temperature variations. The operation can be performed with a scaling function, and therefore, the second operator 406 can be implemented with a multiplier. A third operator 408 can be used to combine the outputs of the core linearizer and second operator with an offset in the y-axis, i.e., vertical axis, to further compensate for temperature variations. In the described exemplary linearizer, the third operator 408 can be an adder. The output of the third operator 408 is a digital gain control signal applied to the receiver.

Figure 5:
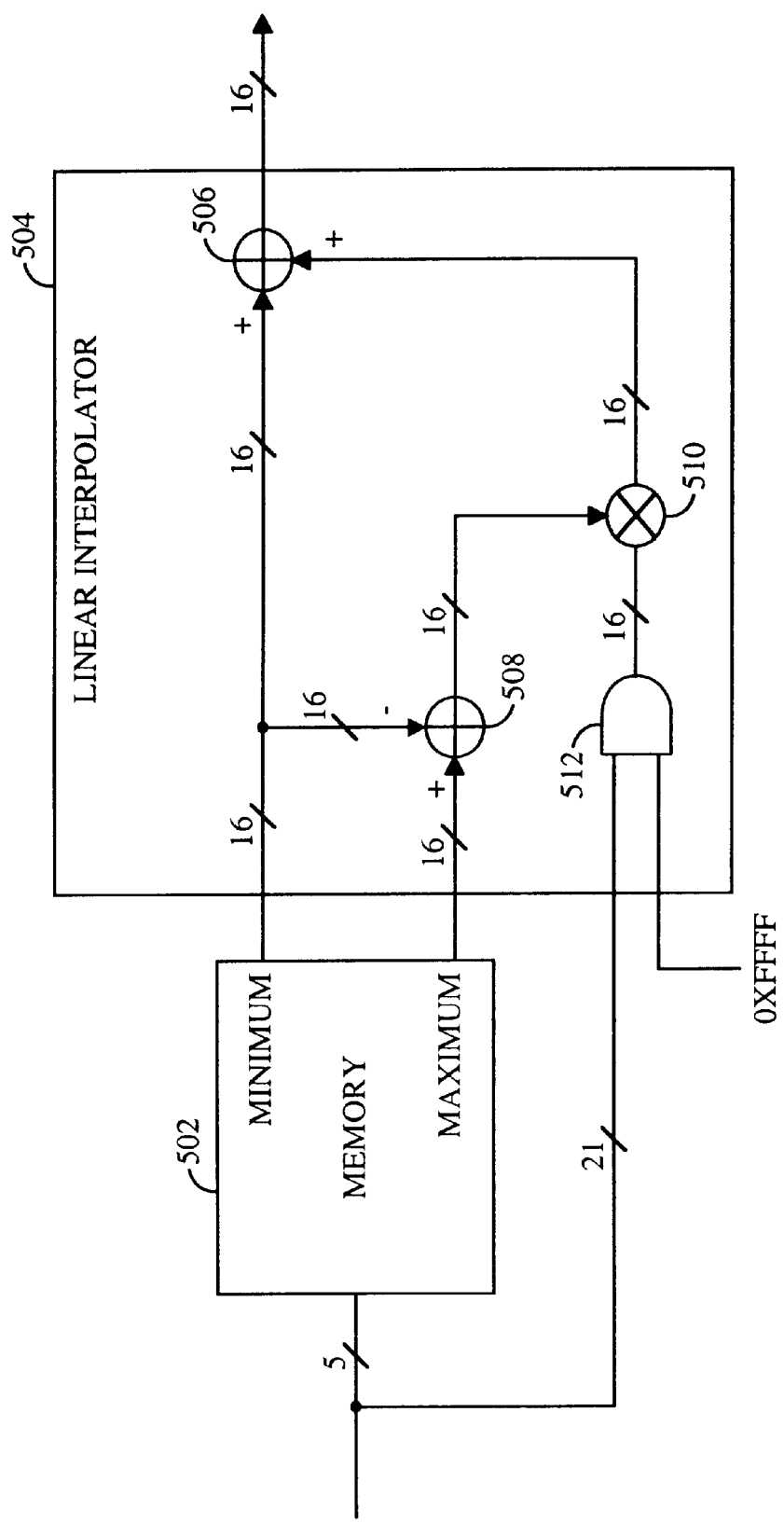
FIG. 5 is a functional block diagram of an exemplary core linearizer for use in the linearizer of FIG. 4.

The core linearizer can be implemented in a variety of fashions depending on the specific application and the overall design constraints. In at least one embodiment, the core linearizer can be implemented in memory with a digital RF or IF gain control value for each AGC value. Thus, if the AGC value input is 16 bits wide and the gain control signal is also 16 bits wide, then a 64 K×16 memory would be required. Alternatively, the memory requirements can be substantially reduced while maintaining the same resolution by using memory in conjunction with a linear interpolator. FIG. 5 is a functional block diagram of an exemplary core linearizer employing this concept. In the exemplary embodiment shown, the most significant bits (MSBs) of the AGC value are applied to memory 502 by truncating the lowest significant bits (LSBs). Those skilled in the art will readily be able to ascertain the number of LSBs to truncate from the AGC value to optimally balance performance tradeoffs between memory consumption and processing complexity. In response to the truncated AGC value applied at the input to memory 502, two values from the predetermined gain curve are output to a linear interpolator 504. The first value represents the digital gain control signal for the truncated AGC value input and sets the minimum value for the interpolation process. The second value represents the digital gain control signal for the next highest truncated AGC value and sets the maximum value for the interpolation process. The linear interpolator 504 interpolates the correct digital gain control signal between the boundaries defined by the two values from memory 502.

The linear interpolator 504 can be implemented in a variety of fashions, and one of ordinary skill in the art will be readily able to construct a linear interpolator to meet their specific design criteria. However, in the interest of completeness, an exemplary linear interpolator will be described. In this exemplary linear interpolator, the minimum value from memory is applied to an adder 506. Next, a value between zero and the difference between the maximum and minimum value is computed and applied to the adder 506 to determine the interpolated digital gain control signal. This can be accomplished by subtracting the minimum value from the maximum value with a subtractor 508. The resultant difference can be provided to a multiplier 510 for a scaling operation. The scaling operation can be performed by shifting the AGC value up by 5 bits and performing an AND operation with $0\text{xFFFF}_{HEX}$ with a gate 512. The 16 LSBs from the gate 512 can then be multiplied with the 16-bit difference value at the multiplier 510. The 16 LSBs of the 32-bit resultant product from the multiplier 510 can be truncated to arrive at the proper interpolation value to be added to the minimum value from the memory 502 by the adder 506. The output of the adder 506 provides a digital gain control signal that varies linearly with the estimated output power from the receiver.

Returning to FIG. 2, gain of the transmitter VGA can be controlled by two power loops. An open loop control 224 can be used to generate an estimate of the optimal reverse link transmission power based on the AGC value from the AGC accumulator 210. The open loop estimate can be computed by means well known in the art to compensate for system parameters such as path loss, the effect of base station loading, and environmentally induced phenomena such as fading and shadowing.

The second power control loop is a closed loop control 226. The closed loop control 226 has the function of correcting the open loop estimate to achieve a desired signal-to-noise ratio (SNR) at the base station. This can be achieved by measuring the reverse link transmission power at the base station and providing feedback to the subscriber station to adjust the reverse link transmission power. The feedback signal can be in the form of a reverse power control (RPC) command which is generated by comparing the measured reverse link transmission power at the base station with a power control set point. If the measured reverse link transmission power is below the set point, then an RPC up command is provided to the subscriber station to increase the reverse link transmission power. If the measured reverse link transmission power is above the set point, then an RPC down command is provided to the subscriber station to decrease the reverse link transmission power. The closed loop control is well known in CDMA communications systems. An adder 228 can be used to combine the results of the open loop estimate with the output of the closed loop control 226.

A power amplifier state machine 230 can be used to control the driver state of the power amplifier in the transmitter. By way of example, the power amplifier can be configured with four different operating power levels by switching in and out one or more of four driver stages. The power amplifier state machine 230 can be used to switch in or out the individual driver stages one after the other as a function of the combined open loop and closed loop computation. In at least one embodiment, the power amplifier includes the capability to bypass and power down completely if the transmit power is low enough such that the transmitter VGA can support the transmission power requirements. With this approach, the power demands on the transmitter VGA can be reduced by increasing the power level of the power amplifier.

Whenever the driver state of the power amplifier changes, it introduces a gain or attenuation step in the transmitter signal path that should be compensated by adjusting the gain of the transmitter VGA in an equal and opposite way. This can be accomplished by adjusting the combined closed and open loop computation that controls the gain of the transmitter VGA in the transmitter with a power amplifier offset. The power amplifier offset is a function of the state of the power amplifier state machine 230. This adjustment can be implemented with a subtractor 232 as shown in FIG. 2.

A transmitter VGA linearizer 234 can be used to compensate the resultant power control value from the subtractor 232 for the non-linearities of the AGC. The transmitter VGA linearizer 234 can be implemented with a linearizer similar to the one described earlier in connection with FIGS. 3–5.

The linearizer concept described throughout can be extended to support multi-media applications. This approach may be particularly attractive when integrating new data services into existing legacy voice equipment. By way of example, the linearizer concept can be used to provide a more robust communications device with a HDR communications system integrated into an existing CDMA cellular telephone. The existing CDMA cellular telephone can be implemented in a manner described in U.S. Pat. No. 4,901, 307, entitled "Spread Spectrum Multiple Access Communication System Using Satellite or Terrestrial Repeaters," and U.S. Pat. No. 5,103,459, entitled "System and Method for Generating Waveforms in a CDMA Cellular Telephone System," both assigned to the assignee of the present invention and incorporated herein by reference.

Figure 6:
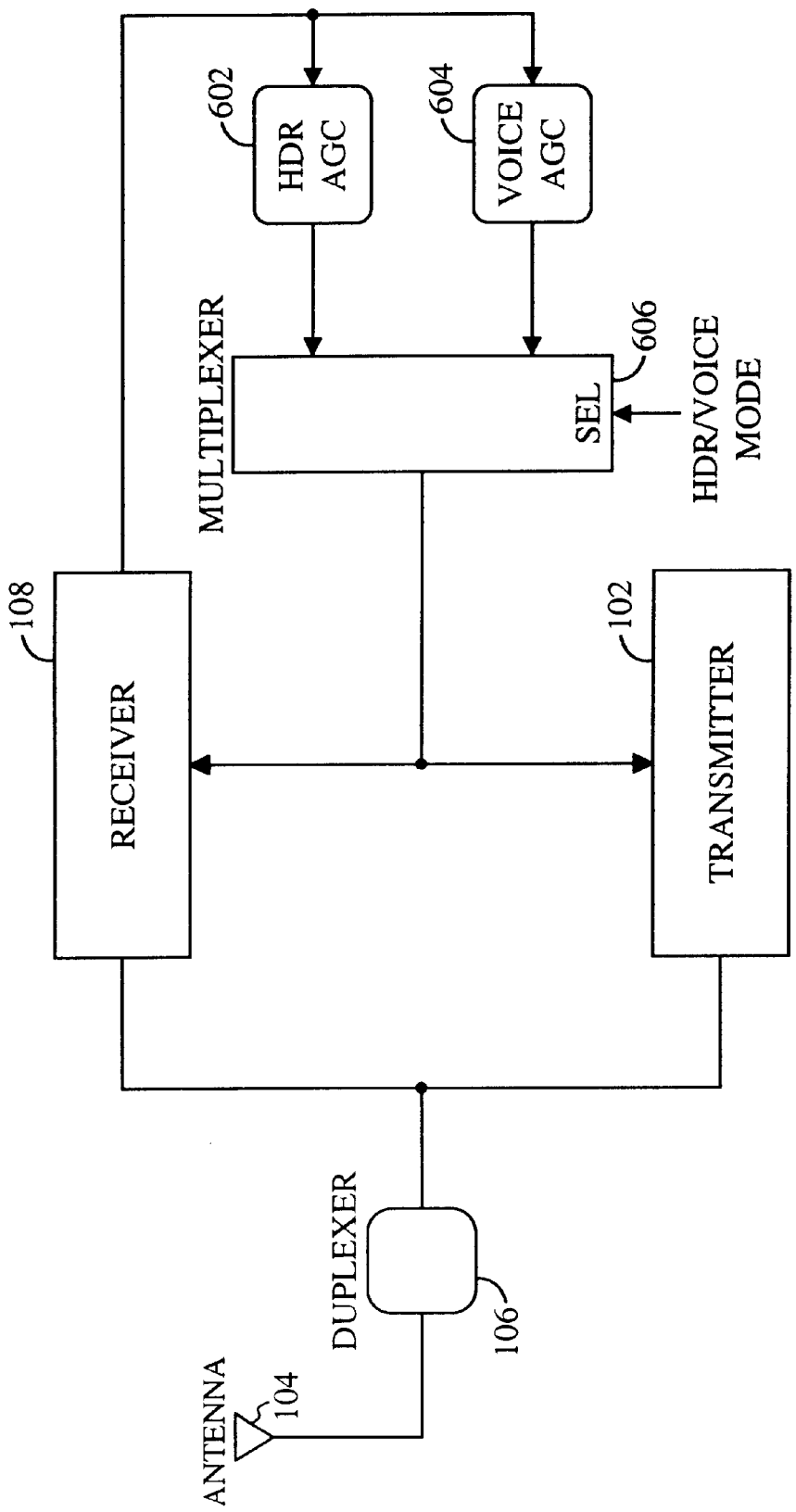
FIG. 6 is a functional block diagram of an exemplary analog front end for a multi-media application employing HDR communications equipment with legacy voice equipment.

A functional block diagram of an exemplary analog frontend for a multi-media application employing HDR communications equipment with legacy voice equipment is shown in FIG. 6. The analog frontend includes a duplexer 106 which couples either the transmitter 102 or the receiver 108 to the antenna 104. The operation of the transmitter 102 and receiver 108 are identical to that described in connection with FIG. 1, and therefore, will not be repeated here, except that the HDR communications and legacy voice equipment share the same transmitter 102 and receiver 108.

In the described exemplary multi-media application, the HDR communications equipment and the legacy voice equipment each have its own AGC. The AGC for the HDR communications equipment 602 (HDR AGC) controls the analog frontend when operating in the HDR mode, and the AGC for the legacy voice equipment 604 (voice AGC) controls the analog frontend when operating in the voice mode. For the purposes of commercialization, it is envisioned that the existing voice AGC 604 in the legacy voice equipment will be utilized. The legacy voice equipment utilized in CDMA cellular telephones of the past typically include an AGC implemented in hardware. The hardware implementation is a very practical approach in view of the speed at which the AGC operates in the legacy voice equipment. However, as those skilled in the art will appreciate, the AGC for the legacy voice equipment can be implemented in any manner without departing from the inventive concepts described throughout. A microprocessor is used to compute new predetermined gain curves to compensate for the nonlinear operation of the transmitter or receiver in response to frequency and temperature variations and reload the linearizer in the hardware.

The HDR AGC 602 can be implemented with a digital signal processor (DSP) with temperature and frequency compensation as described in detail earlier. The DSP is an efficient implementation for the HDR AGC, but an impractical way to implement the AGC in the legacy voice, which typically runs 32 times faster than the HDR's AGC, because it would unnecessarily increase the loading on the DSP. Since the rake receiver is typically implemented in the DSP, this AGC configuration can be easily adaptable to support energy estimations on a per finger basis, selecting the best finger to drive the AGC.

In the exemplary embodiment of the multi-media application shown in FIG. 6, a single calibration procedure can be used to load the hardware linearizer in the voice AGC 602 based on the calibration procedure for the legacy voice equipment. The predetermined gain curve loaded into the hardware linearizer in the voice AGC 602 can then be reformatted by software and loaded into a DSP linearizer in the HDR AGC 604 in a way that is transparent to the equipment manufacturer. This approach may be particularly attractive to the equipment manufacturer because only one calibration procedure is needed to support both the HDR communications equipment and legacy voice equipment, while at the same time providing the convenience and familiarity of the existing calibration procedures for the legacy voice equipment to the equipment manufacturer.

Referring to FIG. 6, the digital baseband signal from the receiver 108 can be fed to both the voice AGC 602 and the HDR AGC 604. Both of the AGCs 602 and 604 will generate the gain control signals for the transmitter 102 and receiver 108. The appropriate gain control signals can be selected by a multiplexer 606 based on a common select signal indicating whether the multi-media application is operating the voice or HDR mode.

Those skilled in the art will appreciate that the various illustrative logical blocks, modules, circuits, and algorithms described in connection with the embodiments disclosed herein may be implemented as electronic hardware, computer software, or combinations of both. To clearly illustrate this interchangeability of hardware and software, various illustrative components, blocks, modules, circuits, and algorithms have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

While the specification describes particular embodiments of the present invention, those of ordinary skill can devise variations of the present invention without departing from the inventive concept.

What is claimed is:

1. A method of gain control, comprising:

amplifying a signal with an amplifier having a gain represented by one of a plurality of gain curves depending on a value of a parameter, the signal being amplified at a first one of the parameter values; and controlling the gain of the amplified signal from a predetermined gain curve relating to the gain curve of the amplifier for a second one of the parameter values by adjusting a gain control signal corresponding to a point on the predetermined gain curve as a function of the first one of the parameter values, and applying the adjusted gain control signal to the amplifier.

2. The method of claim 1 wherein each of the gain curves is non-linear, and the predetermined gain curve is configured to compensate for the non-linear gain curve for the second one of the parameter values.

3. The method of claim 2 wherein the gain control signal is adjusted to compensate for the non-linear gain of the amplifier at the first one of the parameter values.

4. The method of claim 1 wherein the parameter comprises frequency of the received signal.

5. The method of claim 1 wherein the parameter comprises temperature of the amplifier.

6. The method of claim 1 wherein the predetermined gain curve is stored in memory.

7. The method of claim 6 wherein the amplifier comprises a receiver, and wherein the adjustment of the gain control signal comprises estimating power of the amplified signal from the receiver, and adjusting the estimated power as a function of the first one of the parameter values to address the memory.

8. The method of claim 6 wherein the amplifier comprises a transmitter, the method further comprising amplifying a received signal with a receiver, and wherein the adjustment of the gain control signal comprises estimating power of the amplified signal from the receiver, and adjusting the estimated power as a function of the first one of the parameter values to address the memory.

9. The method of claim 6 wherein the adjustment of the gain control signal comprises adjusting the gain control signal in memory as a function of the first one of the parameter values.

10. The method of claim 6 wherein the gain control signal is determined by interpolating between two points on the predetermined gain curve.

11. The method of claim 1 wherein each of the gain curves of the amplifier further depend on a value of a second parameter, the signal being amplified at one of the second parameter values, and wherein the predetermined gain curve further relates to a second one of the second parameter values, and the adjustment of the gain control signal further comprises adjusting the gain control signal as a function of the first one of the second parameter values.

12. The method of claim 11 wherein the parameter comprises frequency of the received signal, and the second parameter comprises temperature of the amplifier.

13. The method of claim 11 wherein the predetermined gain curve is stored in memory.

14. The method of claim 13 wherein the amplifier comprises a receiver, and wherein the adjustment of the gain control signal further comprises estimating power of the amplified signal from the receiver, adjusting the estimated power as a function of the first one of the parameter values to address the memory, reading from the memory the gain control signal from the predetermined gain curve corresponding to the address, adjusting the address as a function of the first one of the second parameter values, and adjusting the gain control signal read from the memory as a function of the first one of the second parameter values and the adjusted address.

15. The method of claim 13 wherein the amplifier comprises a transmitter, the method further comprising amplifying a received signal with a receiver, and wherein the adjustment of the gain control signal further comprises estimating power of the amplified signal from the receiver, adjusting the estimated power as a function of the first one of the parameter values to address the memory, reading from the memory the gain control signal from the predetermined gain curve corresponding to the address, adjusting the address as a function of the first one of the second parameter values, and adjusting the gain control signal read from the memory as a function of the first one of the second parameter values and the adjusted address.

16. The method of claim 15 wherein the gain control signal is determined by interpolating between two points on the predetermined gain curve.

17. The method of claim 1 further comprising copying the predetermined gain curve from a first memory to a second memory, the gain control signal corresponding to a point on the predetermined gain curve from the second memory.

18. An apparatus, comprising:
an amplifier having a gain represented by one of a plurality of gain curves depending on a value of a parameter; and
a gain control configured to control the gain of the amplifier from a predetermined gain curve relating to the gain curve of the amplifier for a first one of the parameter values by adjusting a gain control signal corresponding to a point on the predetermined gain curve as a function of a second one of the parameter values, and applying the adjusted gain control signal to the amplifier.

19. The apparatus of claim 18 wherein the parameter comprises frequency of a signal to be amplified by the amplifier.

20. The apparatus of claim 18 wherein the parameter comprises temperature of the amplifier.

21. The apparatus of claim 18 wherein each of the gain curves is non-linear, and wherein the predetermined gain curve is configured to compensate for the non-linear gain curve for the first one of the parameter values.

22. The apparatus of claim 21 wherein the gain control is further configured to adjust the gain control signal to compensate for the non-linear gain of the amplifier at the second one of the parameter values.

23. The apparatus of claim 18 wherein the gain control comprises memory configured to store the predetermined gain curve.

24. The apparatus of claim 23 wherein the gain control further comprises an interpolator configured to determine the gain control signal from two points on the predetermined gain curve.

25. The apparatus of claim 23 wherein the amplifier comprises a receiver, and wherein the gain control further comprises a power estimator configured to estimate power output from the receiver, and an operator configured to adjust the estimated power as a function of the second one of the parameter values to address the memory.

26. The apparatus of claim 23 further comprises a receiver, wherein the amplifier comprises a transmitter, and the gain control further comprises a power estimator configured to estimate power output from the receiver, and an operator configured to adjust the estimated power as a function of the second one of the parameter values to address the memory.

27. The apparatus of claim 26 wherein the operator comprises an adder.

28. The apparatus of claim 23 wherein the gain control further comprises a combiner configured to adjust the gain control signal as a function of the second one of the parameter values.

29. The apparatus of claim 28 wherein the operator comprises an adder.

30. The apparatus of claim 18 wherein each of the gain curves of the amplifier further depends on a value of a second parameter, and the predetermined gain curve further relates to a first one of the second parameter values, and wherein the gain control adjusts the gain control signal as a function of a second one of the second parameter values.

31. The apparatus of claim 30 wherein the parameter comprises frequency of a signal to be amplified by the amplifier, and the second parameter comprises temperature of the amplifier.

32. The apparatus of claim 30 wherein the gain control further comprises memory configured to store the predetermined gain curve.

33. The apparatus of claim 32 wherein the gain control further comprises an interpolator configured to determine the gain control signal from two points on the predetermined gain curve.

34. The apparatus of claim 32 wherein the amplifier comprises a receiver, and the gain control further comprises a power estimator configured to estimate power output from the receiver, a first operator configured to adjust the estimated power as a function of the second one of the parameter values to address the memory, a second operator configured to adjust the address as a function of the second one of the second parameter values, and a third operator configured to adjust the gain control signal from memory as a function of the second one of the second parameter values as a function of the adjusted address.

35. The apparatus of claim 32 further comprising a receiver, wherein the amplifier comprises a transmitter, and the gain control further comprises a power estimator configured to estimate power output from the receiver, a first operator configured to adjust the estimated power as a function of the second one of the parameter values to address the memory, a second operator configured to adjust the address as a function of the second one of the second parameter values, and a third operator configured to adjust the gain control signal from memory as a function of the second one of the second parameter values as a function of the adjusted address.

36. The apparatus of claim 35 wherein the first and third operators each comprises an adder, and the second operator comprises a multiplier.

37. The apparatus of claim 18 further comprising a first memory configured to store the predetermined gain curve, and wherein the gain control comprises a second memory, the gain control being further configured to copy the predetermined gain curve from the first memory to the second memory, the gain control signal corresponding to a point on the predetermined gain curve from the second memory.

38. Computer readable media embodying a method of controlling gain of an amplifier having a gain represented by one of a plurality of gain curves depending on a value of a parameter, the method comprising:
storing a predetermined gain curve relating to the gain curve of the amplifier for a first one of the parameter values;
adjusting a gain control signal corresponding to a point on the predetermined gain curve as a function of a second one of the parameter values; and
applying the adjusted gain control signal to the amplifier.

39. The computer readable media of claim 38 wherein each of the gain curves is non-linear, and the predetermined gain curve is configured to compensate for the non-linear gain curve for the first one of the parameter values.

40. The computer readable media of claim 39 wherein the gain control signal is adjusted to compensate for the non-linear gain of the amplifier at the second one of the parameter values.

41. The computer readable media of claim 38 wherein the parameter comprises frequency of a signal to be amplified.

42. The computer readable media of claim 38 wherein the parameter comprises temperature of the amplifier.

43. The computer readable media of claim 38 wherein the predetermined gain curve is stored in memory.

44. The computer readable media of claim 43 wherein the amplifier comprises a receiver, and wherein the adjustment of the gain control signal comprises estimating power output from the receiver, and adjusting the estimated power as a function of the second one of the parameter values to address the memory.

45. The computer readable media of claim 43 wherein the amplifier comprises a transmitter, the method further comprising amplifying a received signal with a receiver, and wherein the adjustment of the gain control signal comprises estimating power output from the receiver, and adjusting the estimated power as a function of the second one of the parameter values to address the memory.

46. The computer readable media of claim 43 wherein the adjustment of the gain control signal comprises adjusting the gain control signal as a function of the second one of the parameter values.

47. The computer readable media of claim 43 wherein the gain control signal is determined by interpolating between two points on the predetermined gain curve.

48. The computer readable media of claim 38 wherein each of the gain curves of the amplifier further depend on a value of a second parameter, and wherein the predetermined gain curve further relates to a first one of the second parameter values, and the adjustment of the gain control signal further comprises adjusting the gain control signal as a function of the second one of the second parameter values.

49. The computer readable media of claim 48 wherein the parameter comprises frequency of a signal to be amplified by the amplifier, and the second parameter comprises temperature of the amplifier.

50. The computer readable media of claim 48 wherein the predetermined gain curve is stored in memory.

51. The computer readable media of claim 50 wherein the amplifier comprises a receiver, and wherein the adjustment of the gain control signal further comprises estimating power output from the receiver, adjusting the estimated power as a function of the second one of the parameter values to address the memory, reading from the memory the gain control signal from the predetermined gain curve corresponding to the address, adjusting the address as a function of the second one of the second parameter values, and adjusting the gain control signal read from the memory as a function of the second one of the second parameter values and the adjusted address.

52. The computer readable media of claim 50 wherein the amplifier comprises a transmitter, the method further comprising amplifying a received signal with a receiver, and wherein the adjustment of the gain control signal further comprises estimating power output from the receiver, adjusting the estimated power as a function of the second one of the parameter values to address the memory, reading from the memory the gain control signal from the predetermined gain curve corresponding to the address, adjusting the address as a function of the second one of the second parameter values, and adjusting the gain control signal read from the memory as a function of the second one of the second parameter values and the adjusted address.

53. The computer readable media of claim 50 wherein the gain control signal is determined by interpolating between two points on the predetermined gain curve.

54. The computer readable media of claim 38 wherein the method further comprises copying the predetermined gain curve from a first memory to a second memory, the gain control signal corresponding to a point on the predetermined gain curve from the second memory.

55. An apparatus, comprising:
amplifier means for amplifying a signal, the amplifier means having a gain represented by one of a plurality of gain curves depending on a value of a parameter; and
gain control means for controlling the gain of the amplifier from a predetermined gain curve relating to the gain curve of the amplifier means for a first one of the parameter values by adjusting a gain control signal corresponding to a point on the predetermined gain curve as a function of a second one of the parameter values, and applying the adjusted gain control signal to the amplifier.

56. The apparatus of claim 55 wherein the parameter comprises frequency of the received signal.

57. The apparatus of claim 55 wherein the parameter comprises temperature of the amplifier means.

58. The apparatus of claim 55 wherein each of the gain curves is non-linear, and wherein the predetermined gain curve is configured to compensate for the non-linear gain curve for the first one of the parameter values.

59. The apparatus of claim 58 wherein the gain control means signal generator is further configured to adjust the gain control signal to compensate for the non-linear gain of the amplifier means at the second one of the parameter values.

60. The apparatus of claim 55 wherein the gain control means comprises memory means for storing the predetermined gain curve.

61. The apparatus of claim 60 wherein the gain control means further comprises means for interpolating between two points on the predetermined gain curve to determine the gain control signal.

62. The apparatus of claim 60 wherein the amplifier means comprises a receiver, and the gain control means further means for estimating power output from the receiver, and means for adjusting the estimated power as a function of the second one of the parameter values to address the memory means.

63. The apparatus of claim 60 further comprising a receiver, wherein the amplifier means comprises a transmitter, and the gain control means further means for estimating power output from the receiver, and means for adjusting the estimated power as a function of the second one of the parameter values to address the memory means.

64. The apparatus of claim 60 wherein the gain control means further comprises means for adjusting the gain control signal from the memory as a function of the second one of the parameter values.

65. The apparatus of claim 55 wherein each of the gain curves of the amplifier means further depends on a value of a second parameter, and the predetermined gain curve further relates to a first one of the second parameter values, and wherein the gain control means adjusts the gain control signal as a function of a second one of the second parameter values.

66. The apparatus of claim 65 wherein the parameter comprises frequency of a signal to be amplified by the amplifier means, and the second parameter comprises temperature of the amplifier means.

67. The apparatus of claim 65 wherein the gain control means further comprises memory means for storing the predetermined gain curve.

68. The apparatus of claim 67 wherein the gain control means further comprises means for interpolating between two points on the predetermined gain curve to determine the gain control signal.

69. The apparatus of claim 65 wherein the amplifier means comprises a receiver, and the gain control means comprises means for estimating power output from the receiver, means for adjusting the estimated power as a function of the second one of the parameter values to address the memory means, means for adjusting the address as a function of the second one of the second parameter values, and means for adjusting the gain control signal from memory as a function of the second one of the second parameter values as a function of the adjusted address.

70. The apparatus of claim 65 further comprising a receiver, wherein the amplifier means comprises a transmitter, and the gain control means comprises means for estimating power output from the receiver, means for adjusting the estimated power as a function of the second one of the parameter values to address the memory means, means for adjusting the address as a function of the second one of the second parameter values, and means for adjusting the gain control signal from memory as a function of the second one of the second parameter values as a function of the adjusted address.

71. The apparatus of claim 55 further comprising a first memory means for storing the predetermined gain curve, and wherein the gain control means comprises second memory means and means for copying the predetermined gain curve from the first memory means into the second memory, the gain control signal corresponding to a point on the predetermined gain curve from the second memory means.

72. An apparatus, comprising:
a receiver having a gain represented by one of a plurality of receiver gain curves depending on a value of a receiver parameter;
a transmitter having a gain represented by one of a plurality of transmitter gain curves depending on a value of a transmitter parameter; and
a gain control configured to control the gain of the receiver from a predetermined receiver gain curve relating to the receiver gain curve of the receiver for a first one of the receiver parameter values by adjusting a receiver gain control signal corresponding to a point on the predetermined gain curve as a function of a second one of the receiver parameter values, and applying the adjusted receiver gain control signal to the receiver, the gain control further being configured to control the gain of the transmitter from a predetermined transmitter gain curve relating to the transmitter gain curve of the transmitter for a first one of the transmitter parameter values by adjusting a transmitter gain control signal corresponding to a point on the predetermined transmitter gain curve as a function of a second one of the transmitter parameter values, and applying the adjusted transmitter gain control signal to the transmitter.

73. The apparatus of claim 72 wherein the receiver parameter comprises frequency of a signal to be amplified by the receiver, and the transmitter parameter comprises frequency of the signal to be amplified by the transmitter.

74. The apparatus of claim 72 wherein the receiver parameter comprises temperature of the receiver, and the transmitter parameter comprises temperature of the transmitter.

75. The apparatus of claim 72 wherein each of the receiver and transmitter gain curves is non-linear, and wherein the predetermined receiver gain curve is configured to compensate for the non-linear receiver gain curve for the first one of the receiver parameter values and the predetermined transmitter gain curve is configured to compensate for the non-linear transmitter gain curve for the first one of the transmitter parameter values.

76. The apparatus of claim 75 wherein the gain control is further configured to adjust the receiver gain control signal to compensate for the non-linear gain of the receiver at the second one of the receiver parameter values, and adjust the transmitter gain control signal to compensate for the non-linear gain of the transmitter at the second one of the transmitter parameter values.

77. The apparatus of claim 72 wherein the gain control comprises a power estimator configured to estimate power output from the receiver, and memory configured to store the predetermined receiver and transmitter gain curves, the adjustment of the receiver and transmitter gain control signals from their respective predetermined gain curves being a function of the estimated power.

78. The apparatus of claim 77 wherein the memory comprises a receiver memory configured to store the predetermined receiver gain curve and a transmitter memory configured to store the predetermined transmitter gain curve.

79. The apparatus of claim 78 wherein the gain control further comprises a receiver interpolator configured to determine the receiver gain control signal from two points on the predetermined receiver gain curve from receiver memory, and a transmitter interpolator configured to determine the transmitter gain control signal from two points on the predetermined transmitter gain curve from transmitter memory.

80. The apparatus of claim 72 wherein each of the receiver gain curves of the receiver further depends on a value of a second receiver parameter, and the predetermined receiver gain curve further relates to a first one of the second receiver parameter values, and wherein the gain control adjusts the receiver gain control signal as a function of a second one of the second receiver parameter values, and wherein each of the transmitter gain curves of the transmitter further depends on a value of a second transmitter parameter, and the predetermined transmitter gain curve further relates to a first one of the second transmitter parameter values, and wherein the gain control adjusts the transmitter gain control signal as a function of a second one of the second transmitter parameter values.

81. The apparatus of claim 80 wherein the receiver parameter comprises frequency of a signal to be amplified by the receiver, the transmitter parameter comprises frequency of a signal to be amplified by the transmitter, the second receiver parameter comprises temperature of the receiver, and the second transmitter parameter comprises temperature of the transmitter.

82. The apparatus of claim 80 wherein the gain control comprises a power estimator configured to estimate power output from the receiver, and memory configured to store the receiver and transmitter predetermined gain curves, the adjustment of the receiver and transmitter gain control signals from their respective predetermined gain curves being a function of the estimated power.

83. The apparatus of claim 82 wherein the memory comprises a receiver memory configured to store the predetermined receiver gain curve and a transmitter memory configured to store the predetermined transmitter gain curve.

84. The apparatus of claim 83 wherein the gain control further comprises a first operator configured to adjust the estimated power as a function of the second one of the receiver parameter values to address the receiver memory, a second operator configured to adjust the address to the receiver memory as a function of the second one of the second receiver parameter values, a third operator configured to adjust the receiver gain control signal from the receiver memory as a function of the second one of the second receiver parameter values as a function of the adjusted address to the receiver memory, a fourth operator configured to adjust the estimated power as a function of the second one of the transmitter parameter values to address the transmitter memory, a fifth operator configured to adjust the address to the transmitter memory as a function of the second one of the second transmitter parameter values, and a sixth operator configured to adjust the transmitter gain control signal from the transmitter memory as a function of the second one of the second transmitter parameter values as a function of the adjusted address to the transmitter memory.

85. The apparatus of claim 84 wherein the first, third, fourth and sixth operators each comprises an adder, and the second and fifth operators each comprises a multiplier.

86. The apparatus of claim 72 further comprising a first memory configured to store the predetermined receiver and transmitter gain curves, and wherein the gain control comprises a second memory, the gain control being further configured to copy the predetermined receiver and transmitter gain curves from the first memory to the second memory, the receiver and transmitter gain control signals each corresponding to a point on their respective predetermined gain curves from the second memory.

* * * * *